(12) United States Patent
Liu et al.

(10) Patent No.: US 8,765,497 B2
(45) Date of Patent: Jul. 1, 2014

(54) PACKAGING AND FUNCTION TESTS FOR PACKAGE-ON-PACKAGE AND SYSTEM-IN-PACKAGE STRUCTURES

(75) Inventors: Hao-Juin Liu, Kaohsiung (TW); Chita Chuang, Kaohsiung (TW); Ching-Wen Hsiao, Hsin-Chu (TW); Chen-Shien Chen, Zhubei (TW); Chen-Cheng Kuo, Chu-Pei (TW); Chih-Hua Chen, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 13/225,113

(22) Filed: Sep. 2, 2011

(65) Prior Publication Data

US 2013/0056872 A1     Mar. 7, 2013

(51) Int. Cl.
*H01L 21/66* (2006.01)
*H01L 23/00* (2006.01)
*H01L 23/48* (2006.01)

(52) U.S. Cl.
CPC ........... *H01L 23/48* (2013.01); *H01L 24/97* (2013.01); *H01L 22/14* (2013.01); *H01L 2224/97* (2013.01); *H01L 22/20* (2013.01)
USPC ............................... 438/14; 257/686; 438/15

(58) Field of Classification Search
USPC .................................. 257/686; 438/14, 15
See application file for complete search history.

(56) References Cited

U.S. PATENT DOCUMENTS

| | | | | |
|---|---|---|---|---|
| 7,179,683 B2* | 2/2007 | Low et al. | ...... | 438/108 |
| 7,344,917 B2* | 3/2008 | Gautham | ...... | 438/106 |
| 7,429,786 B2* | 9/2008 | Karnezos et al. | ...... | 257/686 |
| 7,557,443 B2* | 7/2009 | Ye et al. | ...... | 257/723 |
| 2007/0235846 A1* | 10/2007 | Lee et al. | ...... | 257/676 |
| 2007/0254404 A1* | 11/2007 | Gerber et al. | ...... | 438/109 |
| 2009/0039523 A1* | 2/2009 | Jiang et al. | ...... | 257/777 |
| 2010/0258933 A1* | 10/2010 | Fujishima et al. | ...... | 257/686 |
| 2011/0285007 A1* | 11/2011 | Chi et al. | ...... | 257/686 |

* cited by examiner

*Primary Examiner* — David Vu
*Assistant Examiner* — Brandon Fox
(74) *Attorney, Agent, or Firm* — Slater and Matsil, L.L.P.

(57) ABSTRACT

A method includes placing a plurality of bottom units onto a jig, wherein the plurality of bottom units is not sawed apart and forms an integrated component. Each of the plurality of bottom units includes a package substrate and a die bonded to the package substrate. A plurality of upper component stacks is placed onto the plurality of bottom units, wherein solder balls are located between the plurality of upper component and the plurality of bottom units. A reflow is performed to join the plurality of upper component stacks with respective ones of the plurality of bottom units through the solder balls.

14 Claims, 8 Drawing Sheets

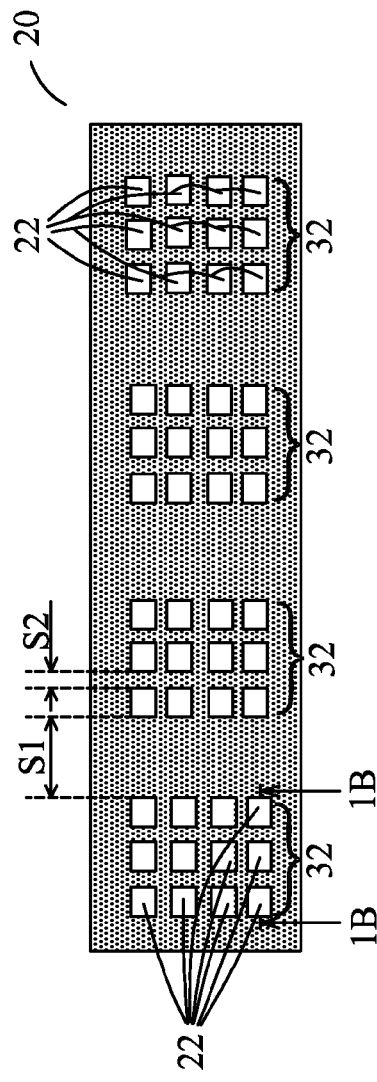
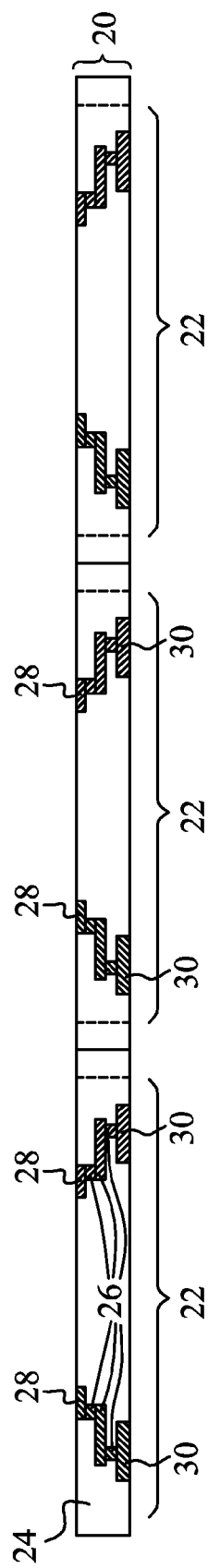
Fig. 1A
Fig. 1B

PACKAGING AND FUNCTION TESTS FOR PACKAGE-ON-PACKAGE AND SYSTEM-IN-PACKAGE STRUCTURES

BACKGROUND

In the packaging of integrated circuits, dies may be packaged onto a package substrate (sometimes known as a laminate substrate), which includes metal connections that may route electrical signals between opposite sides of the laminate substrate. The dies may be bonded onto one side of a laminate substrate using flip chip bonding, and a reflow is performed to melt the solder bumps that interconnect the dies and the laminate substrate. Laminate substrates may be used in package-on-package structures and system-in-package structures.

In a conventional packaging and testing process, a plurality of known-good-dies that is sawed from a wafer is first bonded on a package substrate strip, which comprises a plurality of package substrates therein. The bonding may be a flip chip bonding. Underfill is then dispensed into the gaps between the known-good-dies and the package substrates. Solder balls are also placed on the package substrate strip, and are reflowed. The package substrate strip is then separated into a plurality of units, wherein each of the resulting units has a known-good-die and a single package substrate.

A first function test is performed on the plurality of units to find failed units. Next, each of the plurality of units that passes the first function test is placed on a jig that has the size to fit one unit. An upper component stack may then be placed on the unit. The upper component stack may be a package that includes an additional die and additional package substrate.

Next, the jig, the unit, and the upper component stack go through a reflow process, so that the upper component stack is bonded with the unit to form a package. A second function test may then be performed on the resulting package to determine the quality of the resulting package.

With the increasing down scaling of integrated circuits, the units comprising the packages and the overlying dies also become increasing smaller. This requires that the size of the corresponding jig to be small. The small jigs are difficult to handle during the step of bonding the upper component stacks to the units. This results in a low throughput and possibly a low yield.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 7 are cross-sectional views and top views of intermediate stages in the manufacturing and the testing of packages that comprise package substrates in accordance with various embodiments.

DETAILED DESCRIPTION OF ILLUSTRATIVE EMBODIMENTS

Figure 2:
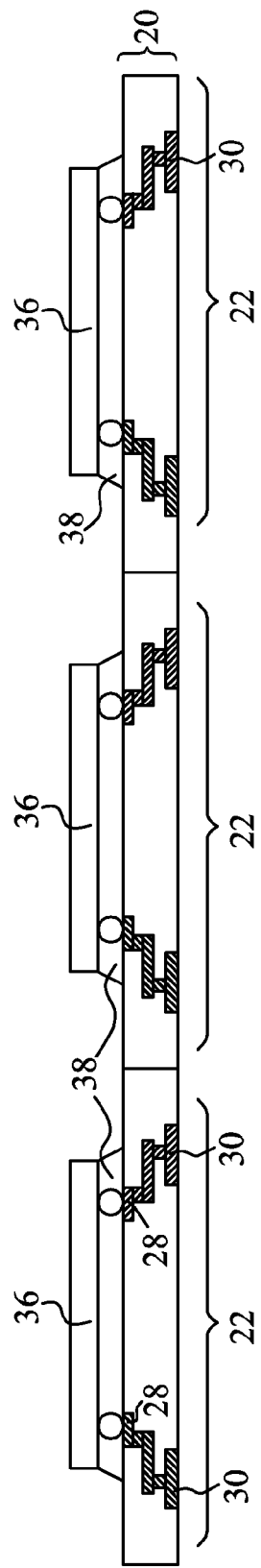

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Methods for packaging and performing function tests are provided in accordance with various embodiments. The intermediate stages of forming a package and the corresponding function tests are illustrated. The variations of the embodiments are discussed. Throughout the various views and illustrative embodiments, like reference numbers are used to designate like elements.

FIG. 1A illustrates a top view of package substrate strip 20, which includes a plurality of package substrates 22. FIG. 1B illustrates a cross-sectional view of a portion of package substrate strip 20, wherein the cross-sectional view is obtained from the plane crossing line 1B-1B in FIG. 1A. Referring to FIG. 1B, in an embodiment, package substrate strip 20 and each of package substrates 22 comprise dielectric layer(s) 24, with metal lines and vias 26 built inside dielectric layers 24. Package substrate strip 20 may be a laminate substrate, wherein the dielectric layers 24 are laminate films that are bonded together through lamination. A plurality of bumps/pads 28, which may be solder bumps or non-reflowable metal bumps/pads, is formed on a side of each of package substrates 22. Metal bumps/pads 28 are electrically coupled to metal features (such as bond pads 30) on the opposite side of the respective package substrates 22.

Referring back to FIG. 1A, the structures of package substrates 22 may be identical to each other. Package substrates 22 may be disposed as a plurality of groups 32, with the inter-group-spacing S1 between groups 32 greater than the inner-group-spacing S2 between package substrates 22 that are in the same group. Each group 32 may include an array of package substrates 22.

Referring to FIG. 2, a plurality of dies 36, which are known-good-dies that are sawed from a wafer, are bonded to package substrate strip 20. The bonding may be a flip chip bonding, for example. Although FIG. 2 illustrates that each of package substrates 22 is bonded with a single die 36, in alternative embodiments, two or more dies may be bonded to the same package substrate 22. Dies 36 may be devices dies that include active integrated circuit devices such as transistors (not shown) therein. Alternatively, dies 36 may be packages that include device die(s), package substrate(s), interposer(s), and the like, in any combination. Underfill 38, which may be a molding underfill, is then dispensed into the gaps between dies 36 and package substrates 22.

Figure 3:
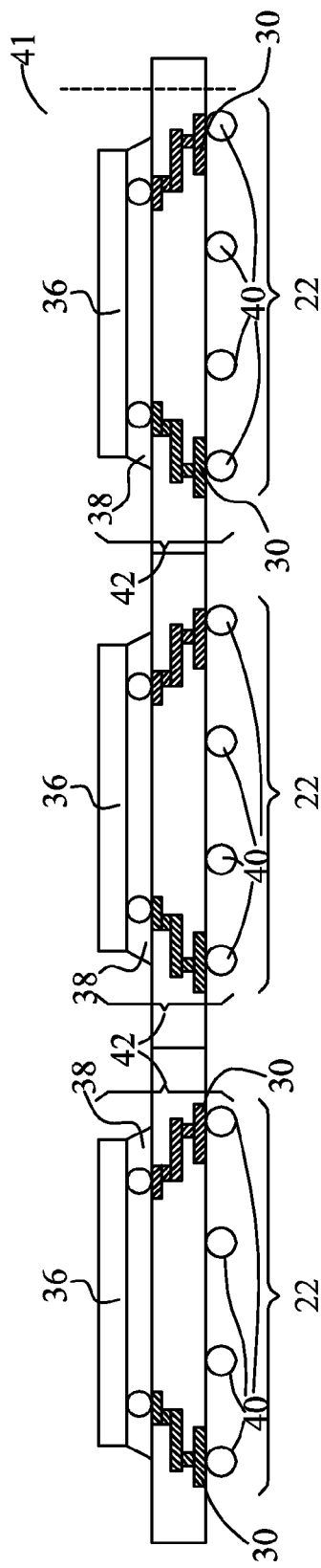

In FIG. 3, solder balls 40 are placed on bond pads 30 of package substrate strip 20, and are reflowed. Accordingly, solder balls 40 are electrically coupled to the devices (not shown) in dies 36. Throughout the description, the structure shown in FIG. 3 is referred to as bottom package component 41, and each of package substrates 22 and the respective overlying dies 36 are in combination referred to as bottom unit 42. Accordingly, bottom package component 41 includes a plurality of bottom units 42.

Figure 4:
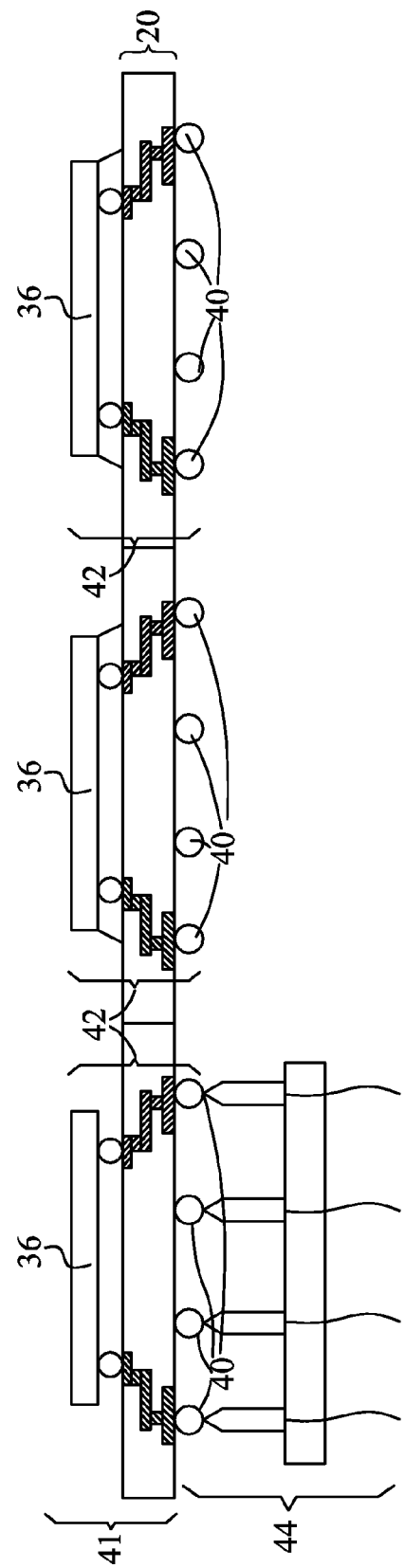

Next, as shown in FIG. 4, a first function test is performed on the plurality of bottom units 42, so that failed bottom units 42 that either do not satisfy electrical performance requirements, and/or have open/short circuits, may be identified. The failed bottom units 42 are marked for further processing in subsequent steps. The first function test may be performed using probe card 44, which may be configured to probe one bottom unit 42 at a time. The first function test may thus include a plurality of probing steps in order to probe all bottom units 42, wherein each of the probing steps is for probing one of bottom units 42. In alternative embodiments, the first function test may be performed using a probe card that is capable of probing a plurality of bottom units 42 at the same time.

In an embodiment, without performing any singulation step, the entire bottom package component 41 as shown in FIG. 4 is sent to have upper component stacks 50 (FIGS.

5A-5C) bonded thereon. In alternative embodiments, before bonding upper component stacks 50, a sawing step may be performed to saw bottom package component 41. Each of the resulting pieces (which are integrated components) sawed from package substrate strip 20 may include two or more package substrates 22 and the corresponding overlying dies 36. For example, the sawing step may be performed according to groups 32 (FIG. 1A), and after sawing, each of the resulting pieces may include all of the package substrates 22 in the same group 32 and the corresponding dies 36. Different groups 32, however, are separated into different pieces. Accordingly, although in the subsequent discussion, the terms "bottom package component 41" or terms "package substrate strip 20" are referred to, it may also represent the pieces sawed from bottom package component 41 or package substrate strip 20, respectively, with each of the pieces comprising a plurality of package substrates 22 and the corresponding overlying dies 36.

Figure 5A:
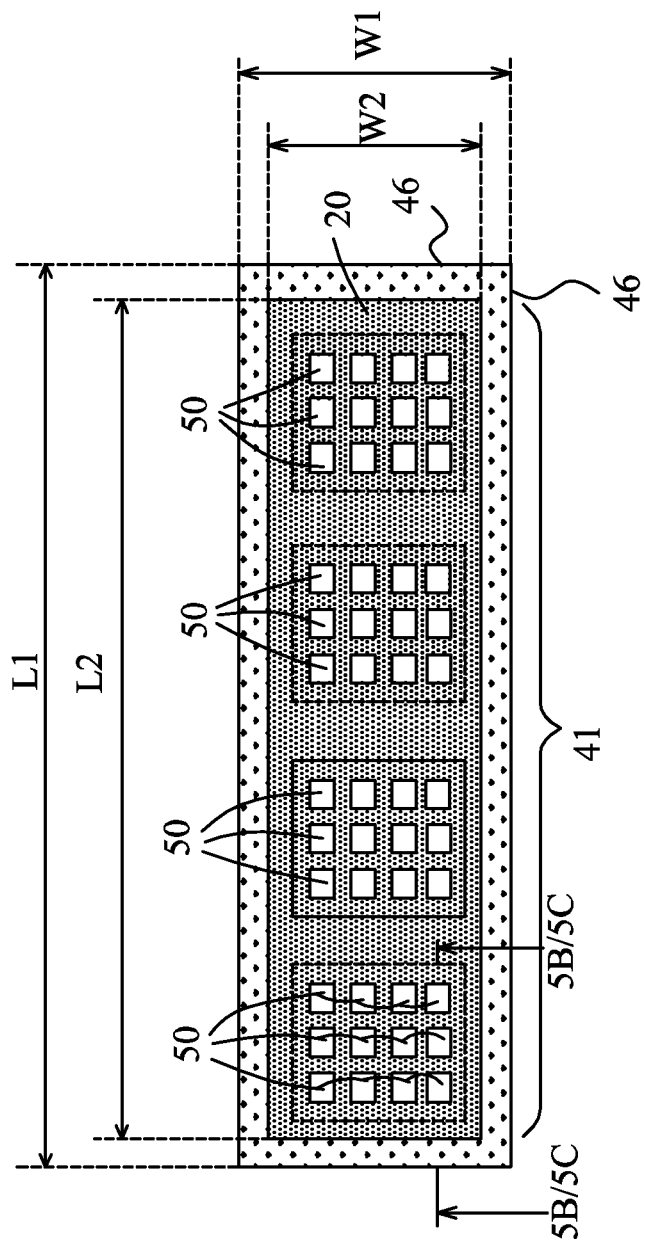
Figure 5B:
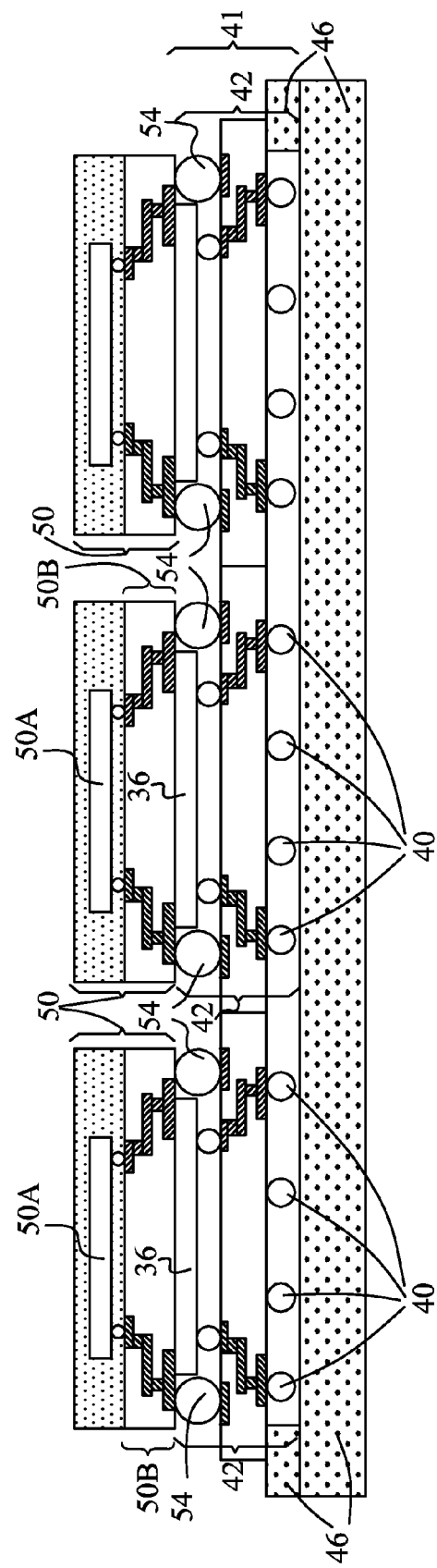
Figure 5C:
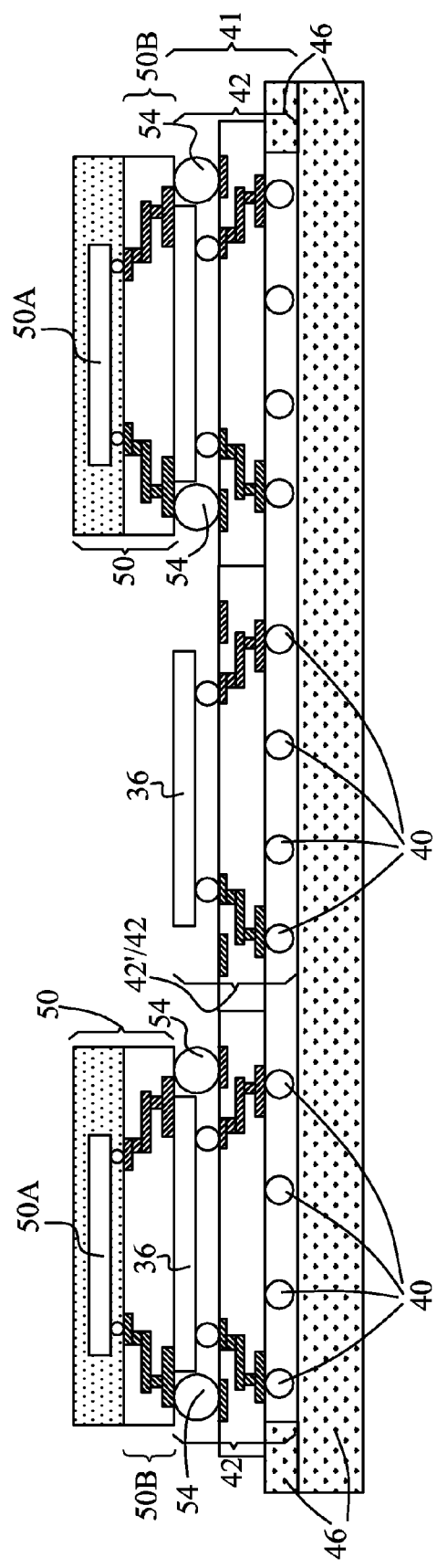

As shown in FIGS. 5A through 5C, package substrate strip 20 is placed on jig 46, followed by the placement and the bonding of upper component stacks 50 onto package substrates 22. FIG. 5A is a top view of the resulting structure, and FIGS. 5B and 5C are cross-sectional views of the structure shown in FIG. 5A, wherein the cross-sectional views are obtained from the plane crossing line 5B/5C-5B/5C in FIG. 5A. In an embodiment in which bottom package component 41 as shown in FIG. 3 is not sawed apart, the size of jig 46 is large enough to accommodate and support the entire package substrate strip 20. Accordingly, the lateral dimensional (such as length L1 and width W1) of jig 46 are close to the respective lateral dimensions L2 and W2 of package substrate strip 20. In alternative embodiments in which bottom package component 41 is sawed apart into smaller pieces, with each of the pieces including at least two, and possibly more, package substrates 22, the size of jig 46 is designed to fit the size of the respective piece that is sawed from bottom package component 41. Solder balls 40 may face, and may contact, jig 46 (FIGS. 5B and 5C).

After bottom package component 41 is placed on jig 46, upper component stacks 50 are placed on dies 36. Referring to FIGS. 5B and 5C, solder balls 54 are disposed between upper component stacks 50 and dies 36. In an embodiment, solder balls 54 that are on the same die 36 are placed on dies 36 first, followed by the placement of the corresponding upper component stack 50 on solder balls 54. In alternative embodiments, solder balls 54 may be pre-placed on upper component stack 50 and reflowed to join upper component stack 50 before the placement of upper component stack 50. Solder balls 54 may have sizes greater than the thickness of dies 36, so that upper components stacks 50 may be located over dies 36, and still electrically coupled to package substrates 22. Upper component stack 50 may be a device die that include active devices (not shown) therein, or a package that includes a component selected from a device die, an interposer, a package substrate, and combinations thereof. For example, each of upper component stack 50 may include device die 50A bonded to package substrate 50B. FIG. 5B illustrates an embodiment wherein all bottom units 42 in bottom package component 41 do not fail, and hence each of bottom units 42 has an overlying upper component stack 50 placed thereon. In alternative embodiments, as shown in FIG. 5C, one of bottom units 42 (marked as 42') was identified as failed in the first function test, and hence no upper component stack 50 is placed on the failed bottom unit 42'.

After the placement of upper component stack 50 onto bottom units 42, a reflow is performed so that solder balls 54 are melted to join upper component stacks 50 to the respective underlying package substrates 22. Accordingly, the integrated circuit devices in upper component stacks 50 are electrically coupled to package substrates 22, and possibly to the respective dies 36, through solder balls 54. During the reflow process, bottom package component 41 remains located on jig 46.

Figure 6:
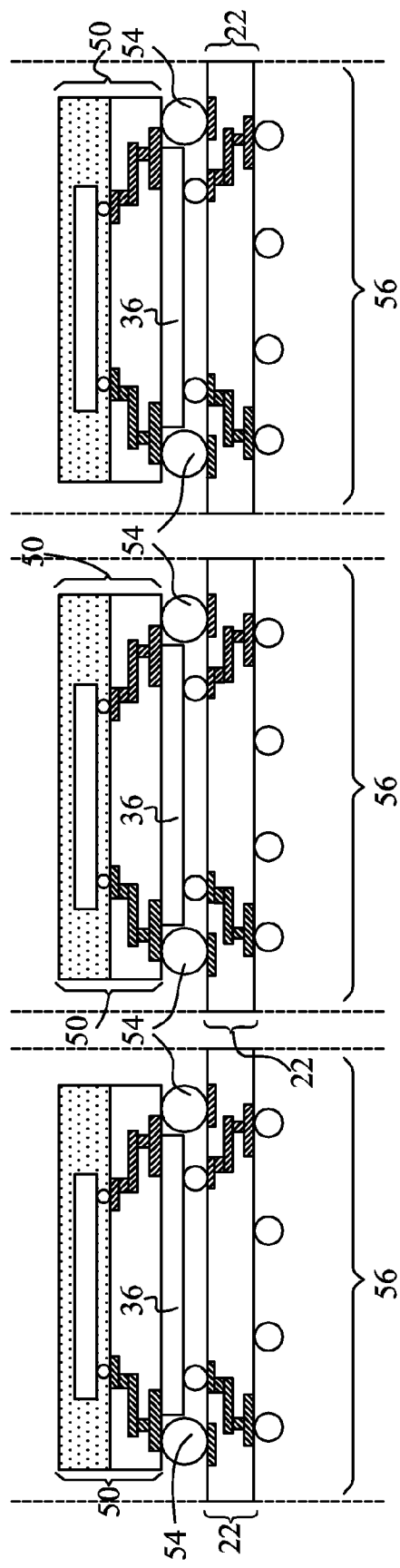

Referring to FIG. 6, after the reflow, bottom package component 41 may be removed from jig 46. A singulation is performed to saw bottom package component 41 and the overlying upper component stack 50 into individual packages 56. Each of packages 56 may include a single package substrate 22, the corresponding overlying die 36, and upper component stack 50.

Figure 7:
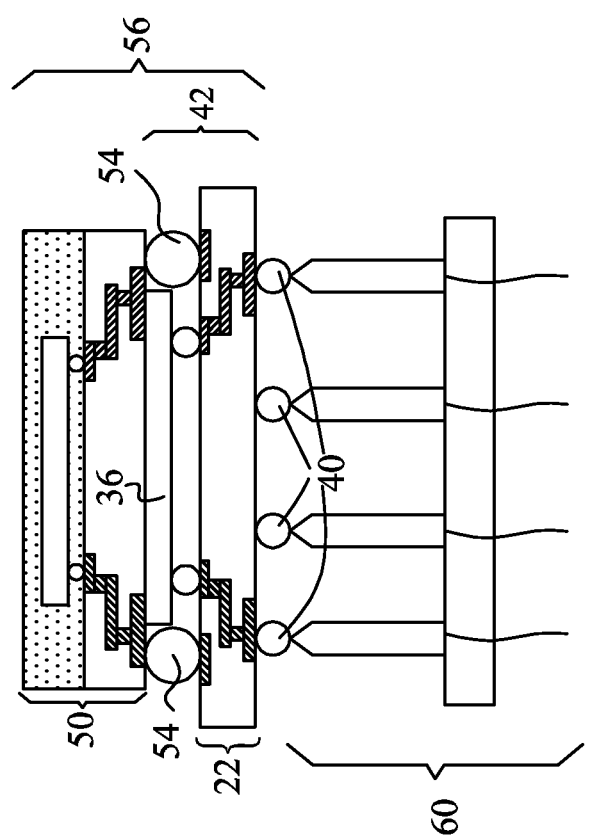

Next, as shown in FIG. 7, a second function test may be performed on each of packages 56 to find the failed packages, wherein probe card 60 may be used to probe solder balls 40.

In the step of placing upper component stack 50 onto dies 36 and reflowing solder balls 54 (FIGS. 5A through 5C), jig 46 accommodates a plurality of bottom units 42 that form the integrated component 41. Accordingly, jig 46 may have a larger size than that for supporting a single package substrate, and the difficulty in the handling of jig 46 and the overlying bottom units is lowered, and the throughput may be increased.

In accordance with embodiments, a method includes placing a plurality of bottom units onto a jig, wherein the plurality of bottom units is not sawed apart and forms an integrated component. Each of the plurality of bottom units includes a package substrate and a die bonded to the package substrate. A plurality of upper component stacks is placed onto the plurality of bottom units, wherein solder balls are located between the plurality of upper component and the plurality of bottom units. A reflow is performed to join the plurality of upper component stacks with respective ones of the plurality of bottom units through the solder balls.

In accordance with other embodiments, a method includes bonding a plurality of dies onto a package substrate strip to form a bottom package component that includes a plurality of bottom units. The package substrate strip includes a plurality of package substrates therein, wherein each of the plurality of bottom units includes one of the plurality of package substrates and one of a plurality of dies. A first function test is performed on the bottom package component. After the step of performing the first function test, the bottom package component is placed onto a jig. A plurality of upper component stacks is placed onto the bottom package component, wherein each of the plurality of upper component stacks is placed on one of the plurality of bottom units. A reflow is performed to join the plurality of upper component stacks with the plurality of bottom units.

In accordance with yet other embodiments, a device includes a package substrate strip that includes a plurality of package substrates, wherein each of the package substrates includes metal features on opposite surfaces, and metal connections electrically coupling the metal features on opposite surfaces. A plurality of dies is disposed over and bonded to the plurality of package substrates. Each of the plurality of dies is bonded to one of the plurality of package substrates. A plurality of upper component stacks is disposed over and bonded to the plurality of package substrates, wherein each of the plurality of upper component stacks is bonded to a respective underlying one of the plurality of package substrates.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    placing a plurality of bottom units onto a jig, wherein the plurality of bottom units is not sawed apart and forms an integrated component, wherein each of the plurality of bottom units comprises:
        a package substrate comprising:
            dielectric layers;
            metal features on opposite sides of the package substrate;
            metal lines and vias in the dielectric layers, wherein the metal lines and vias electrically inter-couple the metal features on the opposite sides of the package substrate; and
            a solder ball facing the jig; and
        a die bonded to the package substrate;
    placing a plurality of upper component stacks onto the plurality of bottom units, wherein solder balls are located between the plurality of upper component and the plurality of bottom units; and
    performing a reflow to join the plurality of upper component stacks with respective ones of the plurality of bottom units through the solder balls, wherein during the reflow, the solder ball is spaced apart from the jig.

2. The method of claim 1 further comprising, before the step of placing the plurality of upper component stacks onto the plurality of bottom units, performing a first function test on the plurality of bottom units.

3. The method of claim 2, wherein a failed one of the plurality of bottom units is identified in the first function test, and wherein at a time the reflow is performed, the failed one of the plurality of bottom units has no upper component stack placed thereon.

4. The method of claim 1 further comprising, after the step of performing the reflow, separating the plurality of bottom units and the plurality of upper component stacks into a plurality of packages, wherein each of the plurality of packages comprises one of the plurality of bottom units and one of the plurality of upper component stacks.

5. The method of claim 4 further comprising, after the step of sawing, performing a second function test to test the plurality of packages.

6. The method of claim 1, wherein the integrated component comprises a package substrate strip comprising a plurality of package substrates, and wherein the plurality of package substrates forms an array.

7. The method of claim 6 further comprising, before the step of placing the plurality of bottom units onto the jig, bonding a plurality of dies onto the package substrate strip, wherein the integrated component comprises a same number of package substrates as the package substrate strip.

8. The method of claim 1, wherein the solder ball extends into a recess of the jig.

9. A method comprising:
    bonding a plurality of dies onto a package substrate strip to form a bottom package component comprising a plurality of bottom units, wherein the package substrate strip comprises a plurality of package substrates therein, and wherein each of the plurality of bottom units comprises one of the plurality of package substrates and one of a plurality of dies;
    performing a first function test on the bottom package component;
    after the step of performing the first function test, placing the bottom package component onto a jig;
    placing a plurality of upper component stacks onto the bottom package component, wherein each of the plurality of upper component stacks is placed on one of the plurality of bottom units; and
    performing a reflow to join the plurality of upper component stacks with the plurality of bottom units, wherein after the reflow, the package substrate strip remains not bonded to the jig, wherein a failed one of the plurality of bottom units is identified in the step of first function test, and wherein at a time the reflow is performed, the failed one of the plurality of bottom units has no upper component stack placed thereon.

10. The method of claim 9, wherein the plurality of package substrates in the bottom package component forms an array.

11. The method of claim 9 further comprising, after the step of performing the reflow, separating the bottom package component and the plurality of upper component stacks bonded thereon into a plurality of packages, wherein each of the plurality of packages comprises one of the plurality of package substrates, one of the plurality of dies, and one of the plurality of upper component stacks.

12. The method of claim 11 further comprising, after the step of sawing, performing a second function test to test one of the plurality of packages.

13. The method of claim 9, wherein the package substrate strip comprises a plurality of solder balls facing the jig, and wherein during the reflow, the plurality of solder balls is spaced apart from the jig by an empty space.

14. The method of claim 13, wherein the plurality of solder balls extends into a recess of the jig during the reflow.

* * * * *